United States Patent
Yokota et al.

(10) Patent No.: US 10,770,629 B2
(45) Date of Patent: Sep. 8, 2020

(54) LIGHT EMITTING DEVICE

(71) Applicant: Sanken Electric Co., Ltd., Niiza-shi, Saitama (JP)

(72) Inventors: Tsutomu Yokota, Niiza (JP); Takaya Ueno, Niiza (JP); Masanori Hoshino, Niiza (JP); Yoshinori Tanaka, Niiza (JP); Hitoshi Murofushi, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 16/087,687

(22) PCT Filed: Jan. 31, 2017

(86) PCT No.: PCT/JP2017/003276
§ 371 (c)(1),
(2) Date: Sep. 24, 2018

(87) PCT Pub. No.: WO2018/142440
PCT Pub. Date: Aug. 9, 2018

(65) Prior Publication Data
US 2019/0088835 A1    Mar. 21, 2019

(51) Int. Cl.
*H01L 33/50* (2010.01)
*H01L 33/62* (2010.01)
(Continued)

(52) U.S. Cl.
CPC ........ *H01L 33/505* (2013.01); *H01L 25/0753* (2013.01); *H01L 33/62* (2013.01); *H01L 33/483* (2013.01); *H01L 33/504* (2013.01)

(58) Field of Classification Search
CPC ... H01L 33/504; H01L 33/505; H01L 33/483; H01L 33/62; H01L 2933/0041;
(Continued)

(56) References Cited

U.S. PATENT DOCUMENTS 8,905,588 B2 * 12/2014 Krames .................. H05B 45/10
362/293
8,970,101 B2 * 3/2015 Sutardja ............. H05B 33/0827
257/88
(Continued)

FOREIGN PATENT DOCUMENTS

JP    2013-45839 A    3/2013
JP    2016-127145 A    7/2016
(Continued)

OTHER PUBLICATIONS

Office action dated May 8, 2019 in a counterpart Japanese patent application.

*Primary Examiner* — Natalia A Gondarenko
(74) *Attorney, Agent, or Firm* — Metrolex IP Law Group, PLLC

(57) ABSTRACT

A light emitting device includes: a substrate (40); blue light emitting elements (10) arranged on the main surface of the substrate (40); and a phosphor sheet (30) containing a phosphor that is excited by emission light from the blue light emitting elements and emits excitation light, the phosphor sheet (30) being disposed above the blue light emitting elements (30), wherein the blue light emitting elements (10) includes first blue light emitting elements (11) which emit first emission light having a first wavelength taken as a peak wavelength of a light emission spectrum, and second blue light emitting elements (12) which emit second emission light having a second wavelength taken as a peak wavelength of a light emission spectrum, and the second wavelength being a longer wavelength than the first wavelength by a wavelength difference of at least 10 nm.

9 Claims, 13 Drawing Sheets

(51) Int. Cl.
*H01L 25/075* (2006.01)
*H01L 33/48* (2010.01)

(58) Field of Classification Search
CPC ....... H01L 2933/005; H01L 2933/0033; H01L 2933/0058; H01L 2933/0083; H01L 2933/0091; H01L 33/50–508; H01L 33/0095; H01L 33/486; H01L 33/52; H01L 33/54; H01L 33/56; H01L 33/382; H01L 25/0753; H01L 25/13; H01L 25/167
USPC ............. 257/79, 88, 89, 98, 102; 438/26, 27
See application file for complete search history.

(56) References Cited

U.S. PATENT DOCUMENTS

| | | |
|---|---|---|
| 9,368,696 B1 | 6/2016 | Murofushi et al. |
| 10,074,635 B2 * | 9/2018 | Tiwari ................. H01L 25/0753 |
| 2002/0130326 A1 * | 9/2002 | Tamura ..................... F21K 9/00 257/79 |
| 2010/0296269 A1 * | 11/2010 | Huang .............. G02F 1/133609 362/97.3 |
| 2012/0262903 A1 * | 10/2012 | Li ........................... F21K 9/232 362/84 |
| 2012/0267659 A1 * | 10/2012 | Chou .................... H01L 33/505 257/98 |
| 2013/0092965 A1 * | 4/2013 | Kijima ...................... F21V 3/04 257/98 |
| 2014/0197431 A1 | 7/2014 | Oka |
| 2015/0055319 A1 * | 2/2015 | Zink ..................... H01L 33/505 362/84 |
| 2016/0223159 A1 | 8/2016 | Katoh et al. |

FOREIGN PATENT DOCUMENTS

| | | |
|---|---|---|
| JP | 2016-129229 A | 7/2016 |
| JP | 2016-162860 A | 9/2016 |
| JP | 2016-219519 A | 12/2016 |
| WO | 2013/015058 A1 | 1/2013 |
| WO | 2016/159141 A1 | 10/2016 |

* cited by examiner

| Ra | 96 |
|---|---|
| R1 | 96 |
| R2 | 96 |
| R3 | 98 |
| R4 | 96 |
| R5 | 96 |
| R6 | 95 |
| R7 | 96 |
| R8 | 97 |
| R9 | 93 |
| R10 | 93 |
| R11 | 97 |
| R12 | 92 |
| R13 | 96 |
| R14 | 99 |
| R15 | 96 |

| Ra | 87 |
|---|---|
| R1 | 87 |
| R2 | 86 |
| R3 | 87 |
| R4 | 88 |
| R5 | 87 |
| R6 | 82 |
| R7 | 90 |
| R8 | 90 |
| R9 | 68 |
| R10 | 70 |
| R11 | 88 |
| R12 | 69 |
| R13 | 86 |
| R14 | 93 |
| R15 | 88 |

| LIGHT EMITTING DEVICE | FIRST ARRANGEMENT REGION | SECOND ARRANGEMENT REGION | PHOSPHOR REGION | OUTPUT LIGHT |
|---|---|---|---|---|
| 1 | SAME CHROMATICITY || 1 | SINGLE COLOR |
| 2 | CHROMATICITY1 | CHROMATICITY2 | 2 | SINGLE COLOR |
| 3 | SAME CHROMATICITY AT COLOR TEMPERATURES A AND B || 2 | ADJUSTED COLOR |
| 4 | CHROMATICITIES 1A,1B | CHROMATICITIES 2A,2B | 4 | ADJUSTED COLOR |

LIGHT EMITTING DEVICE

TECHNICAL FIELD

The present invention relates to a light emitting device that outputs light by excites a phosphor.

BACKGROUND ART

A light emitting device using a light emitting element such as a light emitting diode (LED) and using a phosphor excited by the light emitting element is put into practical use. This light emitting device combines light emission spectra of pieces of light emitted individually from the LED and the phosphor with each other, and outputs light of a predetermined chromaticity. Moreover, a light emitting device of a chip on board (COB) type in which plural light emitting elements are arrayed is disclosed (for example, refer to PTL 1).

CITATION LIST

Patent Literature

PTL 1: International Publication No. 2013/15058

SUMMARY OF INVENTION

Technical Problem

However, regarding such a COB type light emitting device, a study to output light with high color rendering is not insufficient. That is, an influence from dense arrangement of the light emitting elements to emission light of the light emitting elements and to excitation light emitted from the phosphor is not studied sufficiently. It is an object of the present invention to provide a COB-type light emitting device capable of obtaining the output light with high color rendering.

Solution to Problem

In accordance with an aspect of the present invention, there is provided a light emitting device including: a substrate having a main surface on which a first arrangement region and a second arrangement region are defined; a plurality of blue light emitting elements arranged on the main surface of the substrate; and a phosphor sheet containing a phosphor that is excited by emission light from the plurality of blue light emitting elements and emits excitation light, the phosphor sheet being disposed above the plurality of blue light emitting elements, wherein the plurality of blue light emitting elements includes first blue light emitting elements which emit first emission light having a first wavelength taken as a peak wavelength of a light emission spectrum, the first blue light emitting elements being arranged on the first arrangement region, and second blue light emitting elements which emit second emission light having a second wavelength taken as a peak wavelength of a light emission spectrum, the second blue light emitting elements being disposed on the second arrangement region, and the second wavelength being a longer wavelength than the first wavelength by a wavelength difference of at least 10 nm.

Advantageous Effects of Invention

In accordance with the present invention, the COB-type light emitting device capable of obtaining the output light with high color rendering can be provided.

DESCRIPTION OF EMBODIMENTS

Figure 1:
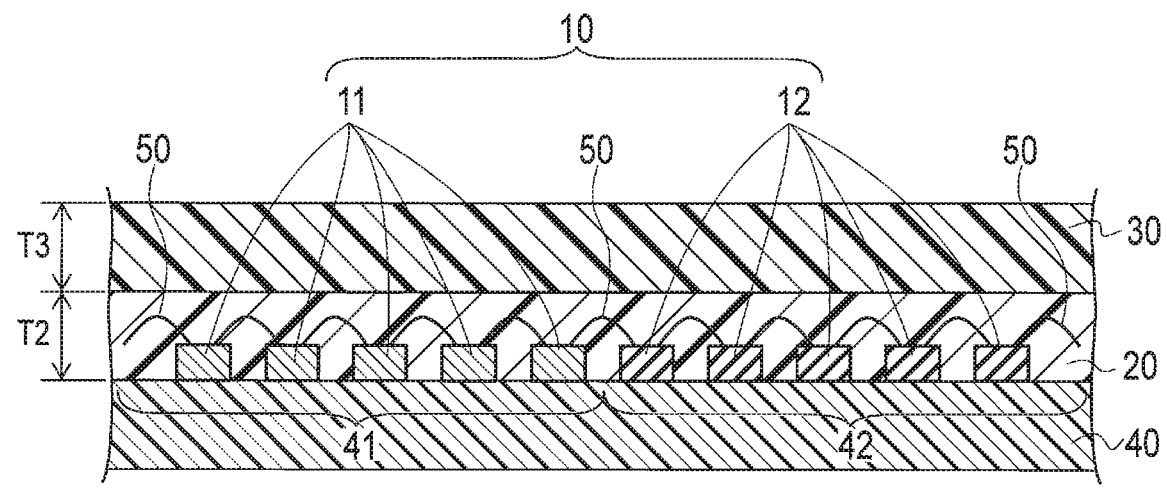
FIG. 1 is a schematic cross-sectional view showing a configuration of a light emitting device according to a first embodiment of the present invention.

Next, a description will be made of embodiments of the present invention with reference to the drawings. In the following description referring to the drawings, the same or similar reference numerals are assigned to the same or similar portions. Moreover, the embodiments shown below are exemplifying an apparatus and a method for embodying the technical idea of this invention, and the technical idea of this invention does not specify shapes, structures, dispositions and the like of constituent components to those described below. The embodiments of this invention can be modified in various ways within the scope of claims.

First Embodiment

As shown in FIG. 1, a light emitting device according to a first embodiment of the present invention includes: a substrate 40; a plurality of blue light emitting elements 10 arranged on a main surface of the substrate 40; and a phosphor sheet 30 disposed above the blue light emitting elements 10. Moreover, an intermediate layer 20 is disposed between the substrate 40 and the phosphor sheet 30 while covering first blue light emitting elements 11 and second blue light emitting elements 12.

The blue light emitting elements 10 include a plurality of the first blue light emitting elements 11 and a plurality of the second blue light emitting elements 12. The "blue light emitting elements 10" are a generic term of the first blue light emitting elements 11 and the second blue light emitting elements 12.

The first blue light emitting elements 11 emit emission light having a first wavelength as a peak wavelength of a light emission spectrum (hereinafter, this emission light is referred to as "first emission light"). The second blue light emitting elements 12 emit emission light having a second wavelength longer than the first wavelength as a peak wavelength of a light emission spectrum (hereinafter, this emission light is referred to as "second emission light"). Here, the "peak wavelength" is a wavelength at a peak value of an intensity of the light emission spectrum. Note that, as will be described later, preferably, a difference between the first wavelength and the second wavelength is 20 nm to 40 nm.

On the main surface of the substrate 40, a first arrangement region 41 and a second arrangement region 42 are defined. The first blue light emitting elements 11 are arranged in the first arrangement region 41, and the second blue light emitting elements 12 are arranged in the second arrangement region 42. As described above, the first blue light emitting elements 11 and the second blue light emitting elements 12 are arranged separately from each other in the different regions on the main surface of the substrate 40.

The phosphor sheet 30 is a sheet containing a phosphor excited by the emission light of the blue light emitting elements 10, and for example, is a silicon resin sheet or the like. The phosphor contained in the phosphor sheet 30 is excited by the first emission light and emits first excitation light, and is excited by the second emission light and emits second excitation light. The phosphor sheet 30 includes phosphors such as a green phosphor and a red phosphor in component and blending ratio set so that output light with a desired chromaticity is output from the light emitting device. For example, light obtained by mixing white light with a first chromaticity and white light with a second chromaticity with each other is output from the light emitting device. Here, the white light with the first chromaticity is obtained by mixing the first emission light and the first excitation light with each other, and the white light with the second chromaticity is obtained by mixing the second emission light and the second excitation light with each other.

The phosphor sheet 30 is pasted on the intermediate layer 20. The phosphor sheet 30 adheres to the intermediate layer 20, and the substrate 40 and the phosphor sheet 30 are integrated with each other via the intermediate layer 20. The emission light from the blue light emitting elements 10 is transmitted through the intermediate layer 20 and enters the phosphor sheet 30. The intermediate layer 20 is formed, for example, by applying a translucent resin to the substrate 40. For the intermediate layer 20, a silicon resin film or the like is suitably used.

By wires 50, the blue light emitting elements 10 are sequentially connected to one another. The wires 50 are connected to a drive power supply (not shown). The blue light emitting elements 10 emit light by a drive current supplied from this drive power supply. The wires 50 can be protected by being buried in the intermediate layer 20 as shown in FIG. 1.

A description will be made below of a method for outputting light with a predetermined chromaticity using the first blue light emitting elements 11 and the second blue light emitting elements 12, which have peak wavelengths different from each other.

While sunlight is a continuous spectrum, light realized using only blue light emitting elements with a single peak wavelength is a discontinuous synthetic spectrum since the light is a combination of spectra. In contrast, two blue light emitting elements having different peak wavelengths are used, and excitation characteristics of the green phosphor and the red phosphor are utilized, whereby light with high color rendering can be output.

In accordance with the study of the inventors of the present invention, the light with high color rendering can be output using the first blue light emitting elements 11 and the second blue light emitting elements 12, which satisfy the following selection conditions. One of the selection conditions is that a chromaticity (first chromaticity) obtained by mixing the first emission light and the first excitation light with each other and a chromaticity (second chromaticity) obtained by mixing the second emission light and the second excitation light with each other are located symmetrically to each other with respect to a predetermined target chromaticity on an xy chromaticity diagram. Another selection condition is that a difference of each of the first chromaticity and the second chromaticity from the target chromaticity are 0.04 or less.

Two pieces of light in which the chromaticities are set symmetrically to each other with respect to the target chromaticity are mixed with each other, whereby output light with the target chromaticity is obtained. Moreover, a color rendering index of the output light can be enhanced as a whole. This is because intensities of the two blue light emitting elements having different peak wavelengths are controlled as below.

In the case of creating output light with a low chromaticity, an amount of phosphor consuming blue light is small, and accordingly, the emission light of each of the blue light emitting elements is reduced less, and the peak value of the intensity of the blue light in the output light is high. Meanwhile, in the case of creating output light with a high chromaticity, the amount of the phosphor is large, and accordingly, the peak value of the intensity of the blue light in the output light is low. As described above, the intensity of the blue light is adjusted by changing the chromaticity. In this way, light with high color rendering can be output in a wide range of 2000 K to 10000 K.

Moreover, the inventors of the present invention found that high color rendering is obtained when the chromaticity difference of each of the first chromaticity and the second chromaticity from the target chromaticity in the xy chromaticity diagram ranges from 0.03 to 0.04. When the chromaticity difference is larger than 0.04, the color rendering decreases, and the color rendering index varies. Particularly, the color rendering index R12 decreases greatly. Hence, in order to output the light with high color rendering, preferably, the chromaticity difference is 0.04 or less.

Figure 2:
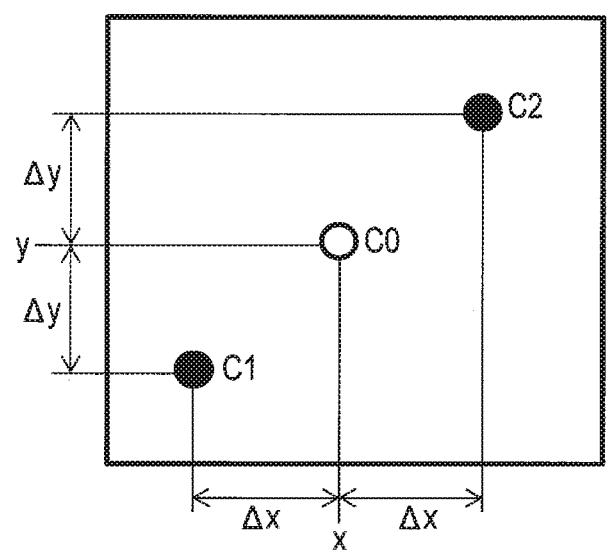
FIG. 2 is an xy chromaticity diagram for explaining a chromaticity difference of a blue light emitting element.

FIG. 2 shows relationship between the first and second chromaticities C1 and C2 and the target chromaticity C0. The chromaticity difference $\Delta C$ is represented by the following equation (1) using a difference $\Delta x$ of the x coordinate and a difference $\Delta y$ of the y coordinate:

$$\Delta C = \{((\Delta x)^2 + (\Delta y)^2\}^{1/2} \tag{1}$$

Moreover, the inventors of the present invention confirmed that the color rendering index can be increased when the peak wavelength of the first blue light emitting elements 11 is included in a wavelength range of 430 nm to 445 nm and the peak wavelength of the second blue light emitting elements 12 is included in a wavelength range of 455 nm to 470 nm. Therefore, such a wavelength difference between the first wavelength and the second wavelength is at least 10 nm, and preferably, 20 nm to 40 nm. Note that, in order to enhance the color rendering of the output light, preferably, the peak of the first blue light emitting elements 11 and the peak of the second blue light emitting elements 12 are completely separated from each other.

The first blue light emitting elements 11 and the second blue light emitting elements 12 are, for example, blue LEDs. InGaN-based blue LEDs and the like are suitably used for the blue light emitting elements 10.

The phosphor sheet 30 contains a green phosphor and a red phosphor which are excited by the emission light of the first blue light emitting elements 11 and the second blue light emitting elements 12 and respectively emit green light and red light. The components and blending ratio of the phosphors contained in the phosphor sheet 30 are set to satisfy the above-described selection conditions. That is, the components and blending ratio of the phosphors contained in the phosphor sheet 30 are set to obtain the light with the first chromaticity C1 as a result of mixing the first emission light of the first blue light emitting elements 11 and the first excitation light emitted from the phosphors excited by the first emission light. Moreover, the components and blending ratio of the phosphors contained in the phosphor sheet 30 are set to obtain the light with the second chromaticity C2 as a result of mixing the second emission light of the second blue light emitting elements 12 and the second excitation light emitted from the phosphors excited by the second emission light.

Note that, in order to obtain the output light with the desired chromaticity, in which all the color rendering indices are high, it is also important to control spectrum shapes by the phosphors excited by the blue light emitting elements 10. In order to obtain output light having predetermined light emission spectra, types of the phosphors contained in the phosphor sheet 30 are selected as appropriate.

For example, as the green phosphor, used is a phosphor that emits green light with a light emission spectrum having a first wavelength indicating a first intensity and a second wavelength indicating a second intensity smaller than the first intensity. Then, as the red phosphor, used is a phosphor that emits red light with an absorption spectrum in which absorption of the green light is less at the second wavelength than at the first wavelength. The green light is consumed by the red phosphor more at the first wavelength than at the second wavelength. Therefore, the intensity of the first wavelength and the intensity of the second wavelength are reversed. As a result, there is obtained output light with a light emission spectrum in which a wavelength balance is good and irregularities in a wavelength distribution are less. Hereinafter, examples of the phosphors contained in the phosphor sheet 30 will be described.

For the green phosphor and a yellow phosphor, a scandate-based oxide or a scandium-based oxide, in which an activator is $Ce^{3+}$, is used. For example, usable are a scandium-based oxide such as $CaSc_2O_4:Ce^{3+}$, and the like, and a scandium-based silicate such as $Ca_3Sc_2Si_3O_{12}:Ce^{3}$, and the like. Moreover, a general phosphor such as YAG, LuAG, and BOSS excited blue light is also usable. For example, usable are: $Y_3Al_5O_{12}:Ce^{3+}$, $Y_3(Al,Ga)_5O_{12}:Ce^{3+}$, $(Y,Gd)_3Al_5O_{12}:Ce^{3+}$, and the like, which are YAG-based; $Lu_3Al_5O_{12}:Ce^{3+}$, and the like, which are LuAG-based; and $(Ba,Sr,Ca)_2SiO_4:Eu^{2+}$, and the like, which are BOSS-based. Moreover, $La_3Si_6N_{11}:Ce$, and the like, which are LSN-based, are also usable.

For the red phosphor, a nitride-based phosphor and the like, which have a wide band, are used. For example, usable are an aluminum nitride-based phosphors such as $CaAlSiN_3:Eu^{2+}$ and $(Sr,Ca)AlSiN_3:Eu^{2+}$, which are activated by $Eu^{2+}$.

Figures 3, 4:
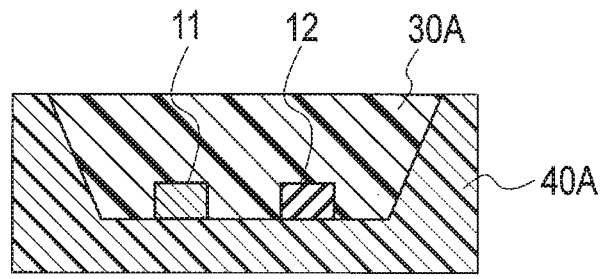
FIG. 3 is a schematic view showing a configuration of a surface mount device (SMD) of a reference example.
FIG. 4 is a table showing color rendering indices of output light of the SMD shown in FIG. 3.

FIG. 3 shows a reference example of a surface mount device (SMD) using each of the first blue light emitting elements 11 and each of the second blue light emitting elements 12, which satisfy the above-described selection conditions. The SMD in the reference example is a 2-in-1 type SMD in which the first blue light emitting element 11 and the second blue light emitting element 12 are mounted one by one on a bottom surface of a recessed portion of a package 40A. The first blue light emitting element 11 and the second blue light emitting element 12 are covered with a phosphor-containing resin 30A filled in a recess of the package 40A.

Components and blending ratio of phosphors contained in the phosphor-containing resin 30A are set so that the phosphors are excited by the first excitation light to emit the first excitation light and are excited by the second emission light to emit the second excitation light. The SMD shown in FIG. 3 mixes light with the first chromaticity and light with the second chromaticity with each other and outputs light with a predetermined chromaticity. Here, the light with the first chromaticity is obtained by mixing the first emission light and the first excitation light with each other, and the light with the second chromaticity is obtained by mixing the second emission light and the second excitation light with each other.

In the SMD shown in FIG. 3, AAA-grade ultra high color rendering output light in which a general color rendering index Ra (average of R1 to R8) at 5000 K was larger than 95 and special color rendering indices Ri (i=9 to 15) were larger than 90 was obtained. FIG. 4 shows the general color rendering index Ra and special color rendering indices Ri of the output light of the SMD shown in FIG. 3.

Figures 5, 6:
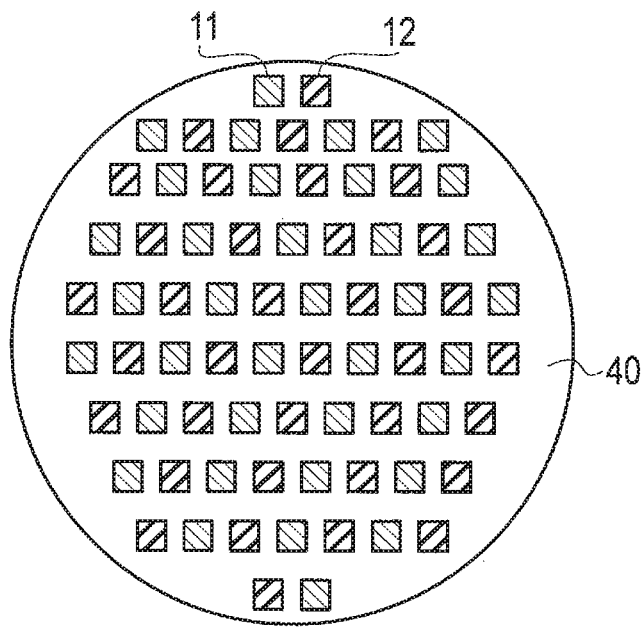
FIG. 5 is a schematic plan view showing a configuration of a light emitting device of a comparative example.
FIG. 6 is a table showing color rendering indices of output light of the light emitting device shown in FIG. 5.

On the basis of the results described above, the inventors of the present invention made a prototype of such a COB-type light emitting device in which the plurality of first blue light emitting elements 11 and the plurality of second blue light emitting elements 12 were arranged on the main surface of the substrate 40 and were covered with the phosphor-containing resin 30A. FIG. 5 shows the light emitting device made as a prototype. FIG. 5 is a plan view in which the first blue light emitting elements 11 and the second blue light emitting elements 12 are displayed through the phosphor-containing resin 30A (not shown). The wires 50 which supply the blue light emitting elements 10 with the drive current are not shown.

In the light emitting device shown in FIG. 5, the first blue light emitting elements 11 and the second blue light emitting elements 12 are arranged alternately with each other on the main surface of the substrate 40. That is, the light emitting device is subjected to hybrid packaging in which the arrangement region of the first blue light emitting elements 11 and the arrangement region of the second blue light emitting elements 12 are not separated from each other.

FIG. 6 shows a general color rendering index Ra and special color rendering indices Ri in the light emitting device shown in FIG. 5. In the light emitting device shown in FIG. 5, the first blue light emitting elements 11, the second blue light emitting elements 12, and the phosphor-containing resin 30A, which were the same as those in the SMD shown in FIG. 3, were used. However, as shown in FIG. 6, such ultra high color rendering output light was not obtained as shown in FIG. 6. Moreover, brightness of the output light of the light emitting device of this comparative example was approximately ⅓ of brightness estimated from brightness of the output light of the SMD.

Figure 7:
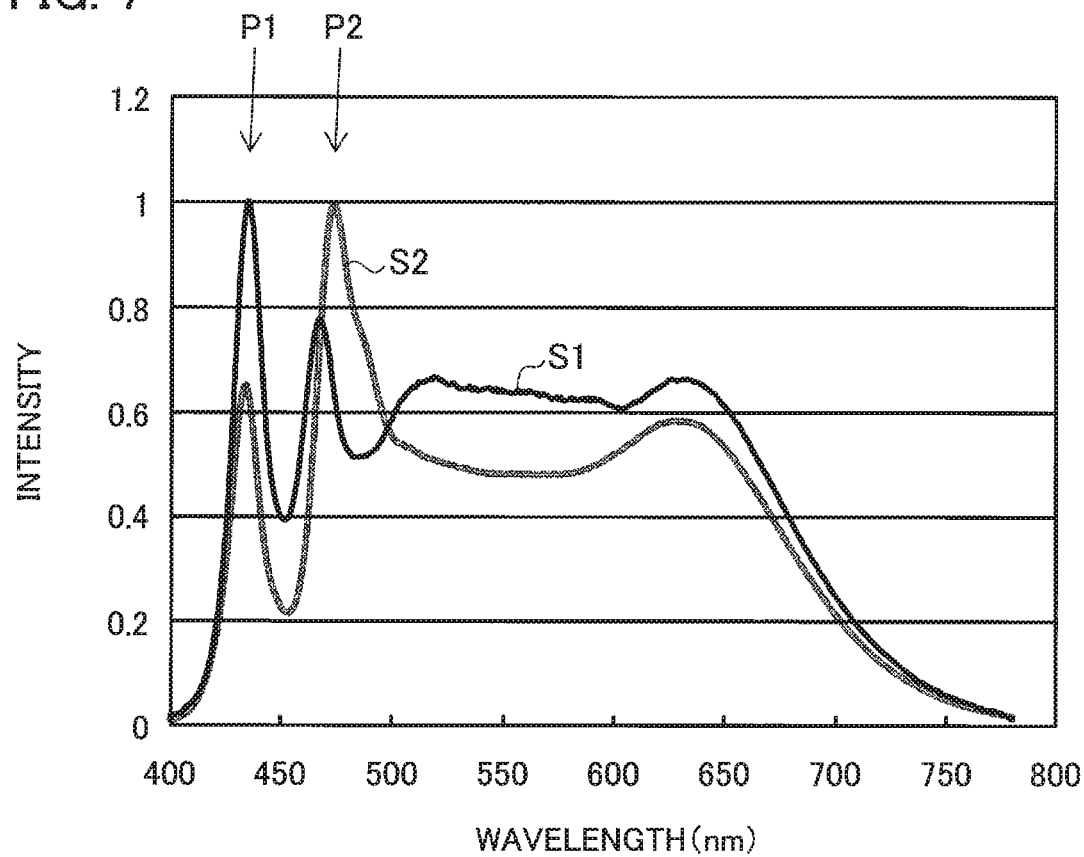
FIG. 7 is a graph showing light emission spectra of pieces of output light of the SMD shown in FIG. 3 and of the light emitting device shown in FIG. 5.

In FIG. 7, the light emission spectrum of the output light of the SMD shown in FIG. 3 is shown as "Characteristic S1", and the light emission spectrum of the light emitting device in the comparative example shown in FIG. 5 is shown as "Characteristic S2". An axis of abscissas in FIG. 7 represents a wavelength, and an axis of ordinates in FIG. 7 represents intensities of Characteristic S1 and Characteristic S2, which are standardized by taking peak values thereof as 1. In FIG. 7, a peak wavelength P1 is a peak wavelength of the first blue light emitting elements 11, and a peak wavelength P2 is a peak wavelength of the second blue light emitting elements 12.

In the light emission spectrum of the light emitting device in the comparative example, which is shown in Characteristic S2, the intensities at the peak wavelength P1 on the short wave side and the peak wavelength P2 on the long wave side have a reverse magnitude relationship to that of the light emission spectrum shown in Characteristic S1. That is, while the intensity of Characteristic S1 at the peak wavelength P1 is higher than the intensity thereof at the peak wavelength P2, the intensity of Characteristic S2 at the peak wavelength P1 is lower than the intensity thereof at the peak wavelength P2. In the light emitting device in the comparative example, the light output on the short wave side is approximately ⅓ of the light output on the long wave side. Moreover, in Characteristic S2, the peak wavelength P2 on the long wave side is further shifted to the long wave side. Hereinafter, regarding a phenomenon where the intensity at the peak wavelength P1 on the short wave side is greatly reduced (hereinafter, this phenomenon will be referred to as a "first phenomenon") and a phenomenon where the peak wavelength P2 is further shifted to the long wave side (hereinafter, this phenomenon will be referred to as a "second phenomenon"), a cause that Characteristic S2 is changed to Characteristic S1 will be studied.

First, the first phenomenon is caused by the fact that, in the light emitting device in the comparative example shown in FIG. 5, the first blue light emitting elements 11 and the second blue light emitting elements 12 are subjected to the hybrid packaging on the substrate 40. The first emission light of the first blue light emitting elements 11 with the short peak wavelength is easily absorbed to the second blue light emitting elements 12 with the long peak wavelength. That is, a large amount of the first emission light emitted from the first blue light emitting elements 11 having a relatively wide band gap is absorbed by the second blue light emitting elements 12 having a relatively narrow band gap. Therefore, in the light emitting device of the comparative example in which the first blue light emitting elements 11 and the second blue light emitting elements 12 are densely mixed, the first emission light is greatly reduced.

In contrast, in the light emitting device shown in FIG. 1, the main surface of the substrate 40 is divided into two regions which are the first arrangement region 41 and the second arrangement region 42, only the first blue light emitting elements 11 are arranged in the first arrangement region 41, and only the second blue light emitting elements 12 are arranged in the second arrangement region 42. In this way, the first emission light can be suppressed from being reduced. That is, the first blue light emitting elements 11 and the second blue light emitting elements 12 are arranged separately from each other, whereby it can be made difficult to absorb the first emission light to the second blue light emitting elements 12. As a result, the first phenomenon can be suppressed.

Figure 8:
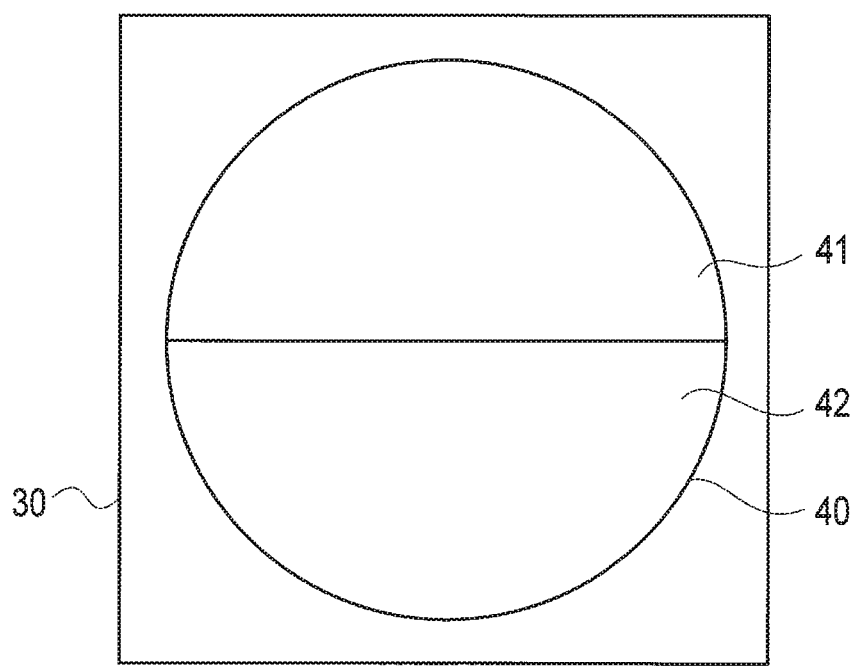
FIG. 8 is a schematic plan view illustrating arrangement regions in a substrate of the light emitting device according to the first embodiment of the present invention.

Note that, in order to suppress the first emission light from being absorbed to the second blue light emitting elements 12, a shorter boundary line between the first arrangement region 41 and the second arrangement region is preferable. Therefore, preferably, the main surface of the substrate 40 is divided into the first arrangement region 41 and the second arrangement region 42 by one boundary line. For example, as shown in FIG. 8, the main surface of the substrate 40 is divided into two by a linear boundary line, and the first arrangement region 41 and the second arrangement region 42 are defined. Note that, in FIG. 8, the phosphor sheet 30 covers the whole of the main surface of the substrate 40.

Incidentally, the number of the first blue light emitting elements 11 is increased more than the number of the second blue light emitting elements 12, whereby the reduction of the first emission light due to the absorption thereof to the second blue light emitting elements 12 can be compensated. For example, the light output on the short wave side is approximately ⅓ of that on the long wave side, a number ratio of the first blue light emitting elements 11 to the second blue light emitting elements 12 is set to 3 to 1. However, in accordance with this measure to change the number ratio, the brightness of the output light of the light emitting device decreases. Hence, effective is the measure to arrange the first blue light emitting elements 11 and the second blue light emitting elements 12 separately from each other.

Figure 9:
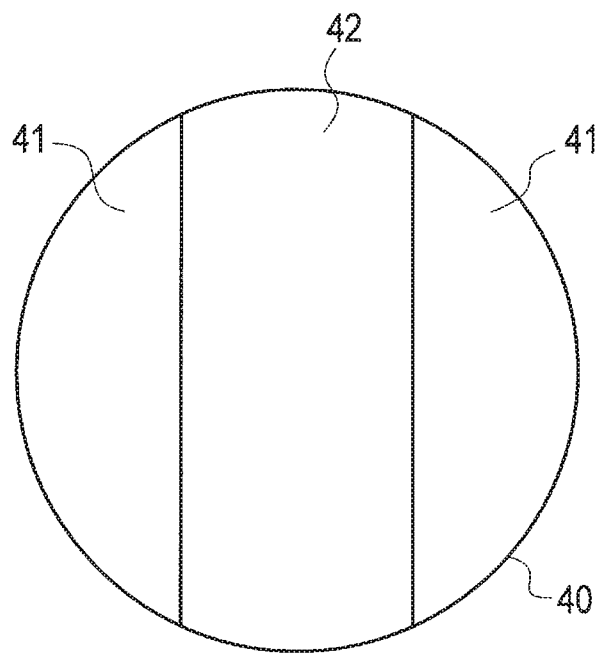
FIG. 9 is a plan view showing another example of the arrangement regions in the substrate of the light emitting device according to the first embodiment of the present invention.
Figure 10:
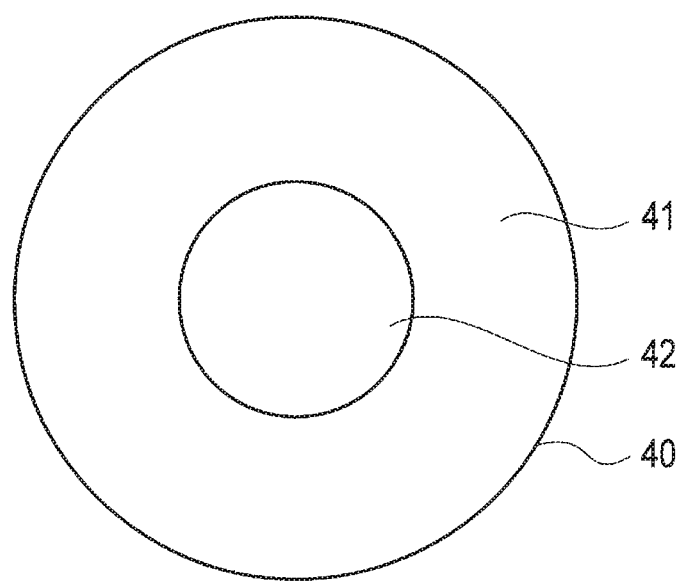
FIG. 10 is a plan view showing still another example of the arrangement regions in the substrate of the light emitting device according to the first embodiment of the present invention.

Note that, in order to suppress the reduction of the intensity at the peak wavelength P1, which is caused by the fact that the first emission light is absorbed to the second blue light emitting elements 12, preferably, the first blue light emitting elements 11 are arranged on the outer side of the main surface of the substrate 40, and the second blue light emitting elements 12 are arranged on the inner side of the main surface of the substrate 40. For example, as shown in FIG. 9, semicircular first arrangement regions 41 are defined on both sides of band-shaped second arrangement region 42. Alternatively, as shown in FIG. 10, the first arrangement region 41 and the second arrangement region 42 may be defined concentrically with each other when viewed from above. That is, a first arrangement region 41 having an annular shape when viewed from above is defined on the outer side of a second arrangement region 42 having a circular shape when viewed from above.

Next, a cause of the second phenomenon will be studied. The second phenomenon is caused since a consumption of the second emission light of the second blue light emitting elements 12 is larger on the short wave side than on the long wave side. This is because a phenomenon where a part of the excitation light excites the phosphor in the inside of the phosphor-containing resin 30A (hereinafter, this phenomenon will be referred to as a "photon recycle") becomes significant by the fact that the blue light emitting elements 10 are densely arranged.

For example, the excitation light emitted from the green phosphor excites the red phosphor, and the excitation light emitted from the red phosphor further excites the red phosphor. By such a photon recycle where the excitation is repeated, the consumption of the second emission light on the short wave side is increased. The photon recycle is a particularly important problem in the light emitting device in which balances between the emission light and excitation light of the first blue light emitting elements 11 and the emission light and excitation light of the second blue light emitting elements 12 are important. Here, the peak wavelengths of the first blue light emitting elements 11 and the second blue light emitting elements 12 are different from each other. A design considering transformation of the light emission spectra by the photon recycle is also possible; however, a degree of freedom in the design decreases.

In order to suppress the photon recycle, it is effective that the light transmits fast through a region where the phosphor is present. That is, an influence of the photon recycle is suppressed by shortening a distance at which light passes through the region containing the phosphor. Therefore, in the light emitting device shown in FIG. 1, the photon recycle is suppressed by reducing a film thickness T3 of the phosphor sheet 30.

As a method of thinning the region where the phosphor is present, a conventional method of using the phosphor sheet is also possible, in which the blue light emitting elements 10 are directly covered with the phosphor sheet, and the phosphor sheet is softened to wrap the blue light emitting elements 10. However, when the blue light emitting elements 10 are packaged in a high density, the emission light and the excitation light are affected by the adjacent blue light emitting elements 10 and the phosphor film, and the object to suppress the influence of the photon recycle cannot be achieved. Accordingly, a structure of fully exhausting the blue light and causing the phosphor film disposed above to convert the blue light was studied.

The above-described phosphor was expected to have a disadvantage that a mean free length of blue transmission light in the phosphor film would be shortened since a density of the phosphor contained in the phosphor film was increased by thinning the same phosphor film. However, thinning of the phosphor film enhanced effective utilization efficiency of the phosphor, that is, reduced phosphor that did not function. This made it possible to reduce weight of the phosphor by 20% to 30%, and to reduce by approximately 10% the blending ratio of the green phosphor particularly affecting the photon recycle. Therefore, it was confirmed that a luminous flux was hardly affected by reducing the phosphor film to a volume ratio approximately ranging from ½ to ¼ from a conventional one. Specifically, the phosphor film with a film thickness of 50 μm to 100 μm was disposed above the blue light emitting elements 10, whereby the COB-type light emitting device was obtained in which the change of the spectrum waveform was reduced and the luminous flux was reduced less.

As described above, as a result of the repeated studies by the inventors of the present invention, it was found that the occurrence of the second phenomenon was suppressed by setting the film thickness T3 of the phosphor sheet 30 to 50 μm to 100 μm.

As described above, in the light emitting device according to the first embodiment of the present invention, the plurality of first blue light emitting elements 11 arranged in the first arrangement region 41 and the plurality of second blue light emitting elements arranged in the second arrangement region 42 are arranged on the main surface of the substrate 40 separately from each other. The first blue light emitting elements 11 and the second blue light emitting elements 12 are not arranged mixedly with each other, whereby it is difficult to absorb the first emission light to the second blue light emitting elements 12. As a result, the first phenomenon where the first emission light is reduced can be suppressed. Moreover, the photon recycle is suppressed by setting the film thickness T3 of the phosphor sheet 30 to 50 μm to 100 μm. As a result, the second phenomenon where the peak wavelength P2 is shifted to the longwave side is suppressed. Hence, in accordance with the light emitting device shown in FIG. 1, the light output is similar to that of the SMD shown in FIG. 3, and ultra high color rendering output light is obtained.

As already described, the supply of the drive current to the blue light emitting elements 10 is performed by the wires 50. For example, a light emitting element array is composed of a plurality of the blue light emitting elements 10 connected in series to one another by the wires 50, and a plurality of the light emitting element arrays is connected in parallel to one another. At this time, the number of the blue light emitting elements 10 included in the light emitting element arrays can be set arbitrarily. However, in order to connect these light emitting element arrays in parallel to one another, it is necessary to equalize, among all the light emitting element arrays, total values of threshold voltages Vf of the blue light emitting elements 10 included in the light emitting element arrays. For example, the number of the first blue light emitting elements 11 included in the individual light emitting element arrays and the number of the second blue light emitting elements 12 included therein are equalized among the light emitting element arrays.

Figure 11:
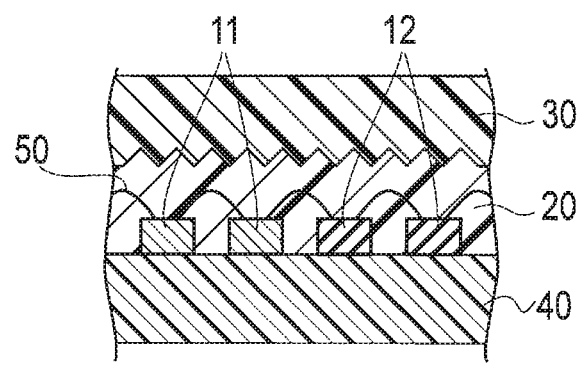
FIG. 11 is a schematic cross-sectional view showing another configuration of the light emitting device according to the first embodiment of the present invention.

In the light emitting device shown in FIG. 1, the emission light from the blue light emitting elements 10 is transmitted through the intermediate layer 20 and enters the phosphor sheet 30. Therefore, a light-transmitting material is used for the intermediate layer 20. For example, a transparent resin film is used for the intermediate layer 20. Alternatively, light may be scattered in the inside of the intermediate layer 20 by using a filler-containing resin film, and so on. Moreover, as shown in FIG. 11, prism-shaped protrusions having a substantially triangular cross section may be formed on an interface between the intermediate layer 20 and the phosphor sheet 30, whereby it may be made easy for the light having passed through the intermediate layer 20 to enter the phosphor sheet 30.

Note that, preferably, a refractive index of the intermediate layer 20 is lower than a refractive index of the phosphor sheet 30. In this way, the emission light from the blue light emitting elements 10 is suppressed from being reflected on the interface between the intermediate layer 20 and the phosphor sheet 30, and the output efficiency of the light emitting device can be prevented from decreasing.

Incidentally, when a distance between the blue light emitting elements 10 and the phosphor sheet 30 is shorter than a certain extent, that is, when the film thickness T2 of the intermediate layer 20 is thin, color unevenness may occur on the light output surface of the phosphor sheet 30. Specifically, the blue light becomes intense above the blue light emitting elements 10, and the color of the excitation light from the phosphor becomes intense above an intermediate region between each of the blue light emitting elements 10 and each of the blue light emitting elements 10. The reason for the above is as follows. When the film thickness T2 of the intermediate layer 20 is thin, a quantity of the emission light from the blue light emitting elements 10, the emission light entering the phosphor sheet 30, is smaller above the intermediate region than above the blue light emitting elements 10.

The color unevenness of the light output surface of the phosphor sheet is not regarded as a very serious problem when direct irradiation with the output light from the light emitting device is performed. When irradiation with the output light from the light emitting device through an optical element such as a lens is performed, the color unevenness may appear as a color difference.

Figure 12:
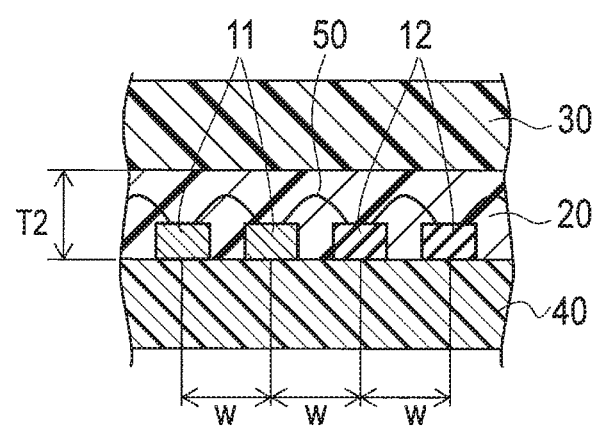
FIG. 12 is a schematic view for explaining a film thickness of an intermediate layer and an arrangement interval of blue light emitting elements in the light emitting device according to the first embodiment of the present invention.

In order to suppress the color unevenness of the light output surface of the phosphor sheet 30, it is effective to increase a distance between the blue light emitting elements 10 and the phosphor sheet 30. That is, the film thickness T2 of the intermediate layer 20 is increased to an extent where the color unevenness of the phosphor sheet 30 does not occur. For example, an incident angle at which the emission light from the blue light emitting elements 10 enters the phosphor sheet 30 is set to 45 degrees or less in the intermediate region. For this, the film thickness T2 of the intermediate layer 20 is increased more than ½ of an arrangement interval W of the blue light emitting elements 10 (see FIG. 12). In this way, there can be suppressed the color unevenness of the light output surface of the phosphor sheet 30 due to the fact that the quantity of the emission light from the blue light emitting elements 10, the emission light entering the region above the intermediate region, is small.

Second Embodiment

Figure 13:
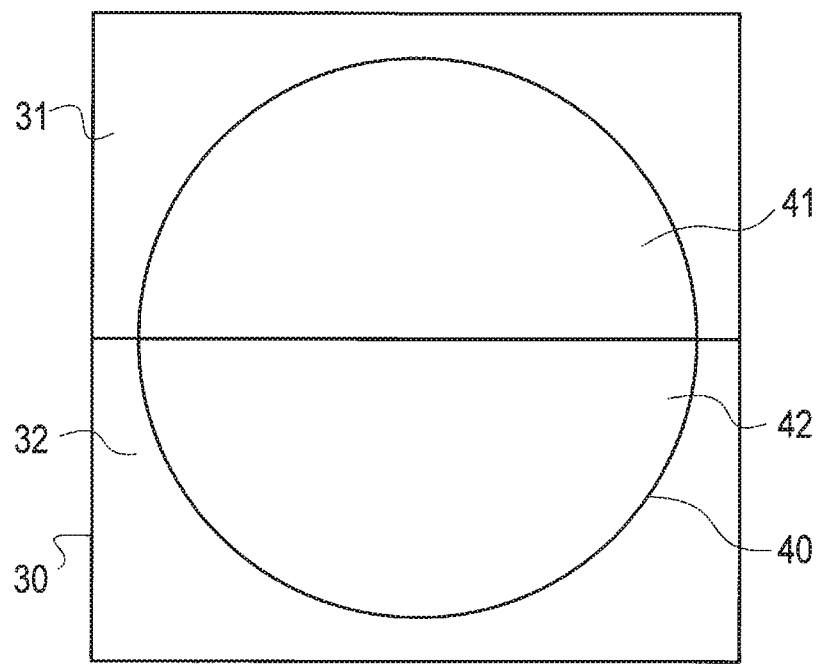
FIG. 13 is a schematic plan view showing a configuration of a light emitting device according to a second embodiment of the present invention.

In a light emitting device according to a second embodiment of the present invention, as shown in FIG. 13, the phosphor sheet 30 is divided into a first phosphor region 31 and a second phosphor region 32 when viewed from above. The first phosphor region 31 and the second phosphor region 32 are different from each other in at least either of the components and blending ratios of the phosphor contained therein. The light emitting device shown in FIG. 13 is different in that the phosphor sheet 30 is divided from the light emitting device according to the first embodiment, in which the whole of the main surface of the substrate 40 is covered with the phosphor sheet 30 containing the phosphor with the fixed components and blending ratio. Other configurations are the same as those of the first embodiment. Hereinafter, the individual regions of the divided phosphor sheet 30 will be referred to as "phosphor regions". The individual regions of the divided main surface of the substrate 40 will be referred to as "arrangement regions".

Figure 14:
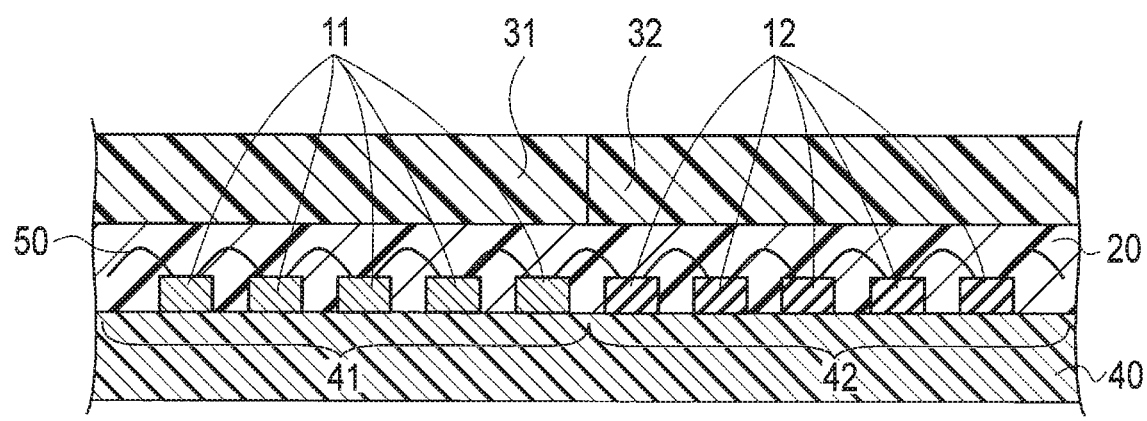
FIG. 14 is a schematic cross-sectional view showing the configuration of the light emitting device according to the second embodiment of the present invention.

In the light emitting device shown in FIG. 13, as shown in FIG. 14, the first phosphor region 31 is disposed on the whole of an area above the first arrangement region 41, and the second phosphor region 32 is disposed on the whole of an area above the second arrangement region 42. The phosphor contained in the first phosphor region 31 is excited by the first emission light of the first blue light emitting elements 11, and the first excitation light is emitted. Then, the first emission light and the first excitation light are mixed with each other, and light with Chromaticity 1 is output. Meanwhile, the phosphor contained in the second phosphor region 32 is excited by the second emission light of the second blue light emitting elements 12, and the second excitation light is emitted. Then, the second emission light and the second excitation light are mixed with each other, and light with Chromaticity 2 is output. As described above, in the light emitting device shown in FIG. 13, the light with Chromaticity 1 and the light with Chromaticity 2 are output.

In the light emitting device according to the second embodiment, the components and blending ratios of the phosphor contained in the first phosphor region 31 and the phosphor contained in the second phosphor region 32 can be changed independently of each other. Therefore, light can be output from the light emitting device by various combinations of the first chromaticity and the second chromaticity. Others are substantially similar to those of the first embodiment, and a duplicate description will be omitted.

The phosphor sheet 30 is easy to process accurately into an arbitrary shape. Therefore, using the phosphor sheet 30, the phosphor regions can be easily set in response to the arrangement regions of the substrate 40. When the phosphor film is formed not by disposing the phosphor sheet 30 but by applying a resin containing the phosphor, it is difficult to form the phosphor regions accurately. For example, in the case of applying the resin, it is necessary to form partition wall in response to the boundary line between the arrangement regions. However, it is difficult to form the partition wall with high accuracy, and variations in chromaticity occur.

Note that, in order to reduce the mixture of the emission light from the blue light emitting elements 10 on a boundary surface between the first phosphor region 31 and the second phosphor region 32, preferably, the film thickness T2 of the intermediate layer 20 is smaller. Therefore, the film thickness T2 of the intermediate layer 20 is set, for example, to a thickness as small as the whole of the wires 50 is embedded therein. However, as already described, in order to suppress the color unevenness of the light output surface of the phosphor sheet 30, preferably, the film thickness T2 of the intermediate layer 20 is larger than ½ of the arrangement interval W of the blue light emitting elements 10.

<First Modification>

In the light emitting device shown in FIG. 13, one phosphor region is disposed in one arrangement region. That is, the first phosphor region 31 is disposed to overlap the first arrangement region 41, and the second phosphor region 32 is disposed to overlap the second arrangement region 42.

However, the phosphor regions and the arrangement regions do not have to correspond to each other in a one-to-one relationship. That is, a plurality of the phosphor regions may be disposed with respect to one arrangement region.

Figure 15:
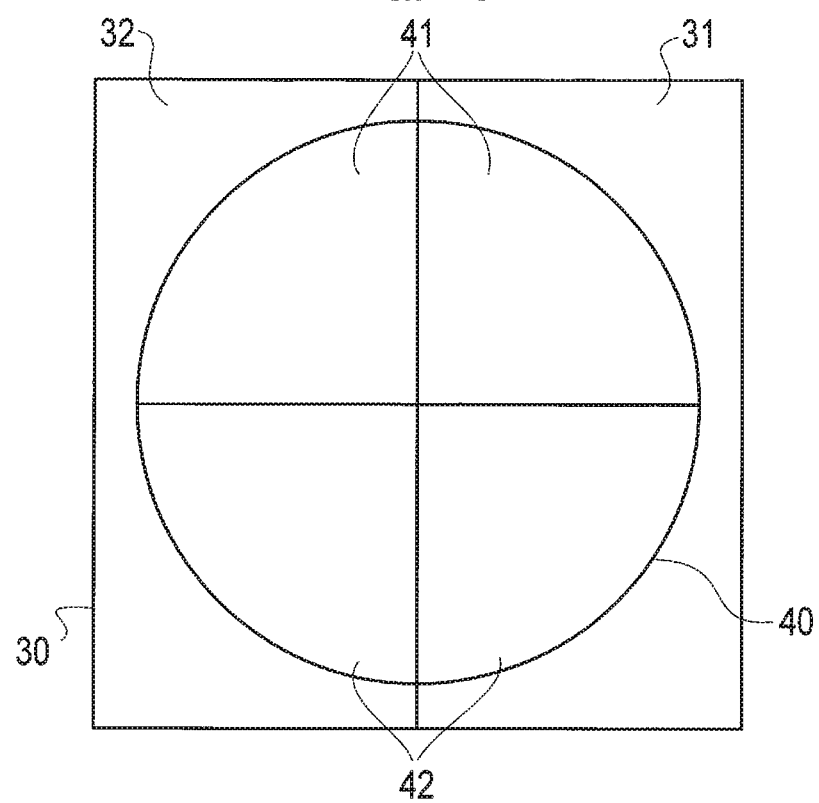
FIG. 15 is a schematic plan view showing a configuration of a light emitting device according to a first modification of the second embodiment of the present invention.

For example, in the light emitting device shown in FIG. 15, the first phosphor region 31 is disposed continuously on a part of the area above the first arrangement region 41 and a part of the area above the second arrangement region 42. Then, the second phosphor region 32 is disposed continuously on the other part of the area above the first arrangement region 41 and the other part of the area above the second arrangement region 42.

Therefore, light obtained by mixing the first emission light and excitation light with each other, the excitation light being excited by the first emission light and excited in the first phosphor region 31, and light obtained by mixing the second emission light and excitation light with each other, the excitation light being excited by the second emission light and excited in the first phosphor region 31, are mixed with each other. In this way, an output light with Color temperature A is obtained. Meanwhile, light obtained by mixing the first emission light and excitation light with each other, the excitation light being excited by the first emission light and excited in the second phosphor region 32, and light obtained by mixing the second emission light and excitation light with each other, the excitation light being excited by the second emission light and excited in the second phosphor region 32, are mixed with each other. In this way, an output light with Color temperature B is obtained.

As described above, in the light emitting device shown in FIG. 15, the plurality of phosphor regions different from each other in components and blending ratio of the phosphor are disposed with respect to one arrangement region, and such regions with different color temperatures are formed. Therefore, while the light with the designed predetermined color temperature is output in each of the light emitting devices shown in FIG. 8 and FIG. 13, the light emitting device shown in FIG. 15 is capable of adjusting the color of the output light by adjusting the color temperature thereof. That is, a magnitude and pulse cycle of the drive current are adjusted to adjust the intensity of the emission light from the blue light emitting elements 10 for each of the phosphor regions, thus making it possible to adjust the color of the output light of the light emitting device within a fixed range. For example, phosphor regions set to obtain output light of 3000 K and 5000 K are individually prepared, thus making it possible to adjust the color of the output light within a range of 3000 K to 5000 K.

<Second Modification>

In the light emitting device shown in FIG. 15, such a common phosphor region is disposed with respect individually to the parts of the different arrangement regions. In contrast, a plurality of different phosphor regions may be disposed for each of the arrangement regions.

Figure 16:
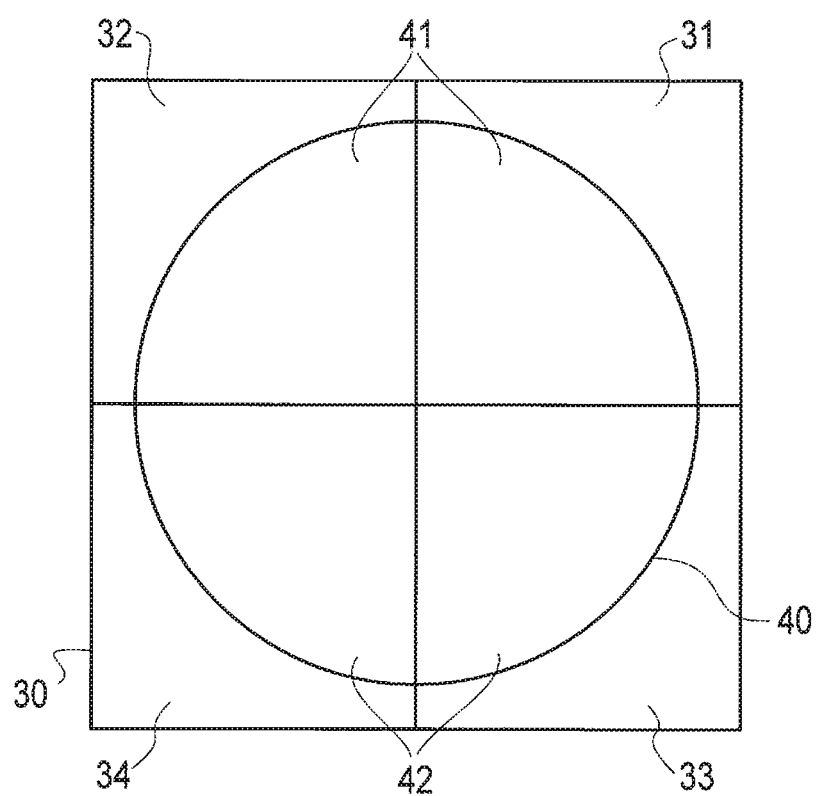
FIG. 16 is a schematic plan view showing a configuration of a light emitting device according to a second modification of the second embodiment of the present invention.

For example, in a light emitting device shown in FIG. 16, the first phosphor region 31 is disposed on a part of the area above the first arrangement region 41, and the second phosphor region 32 is disposed on the other part of the area above the first arrangement region 41. Then, a third phosphor region 33 is disposed on a part of the area above the second arrangement region 42, and a fourth phosphor region 34 is disposed on the other part of the area above the second arrangement region 42. That is, the phosphor sheet 30 is divided into four phosphor regions.

In this way, for example, light with Chromaticity 1A can be output from a region where the first phosphor region 31 is disposed in the first arrangement region 41, and light with Chromaticity 1B can be output from a region where the second phosphor region 32 is disposed in the first arrangement region 41. Moreover, light with Chromaticity 2A can be output from a region where the third phosphor region 33 is disposed in the second arrangement region 42, and light with Chromaticity 23 can be output from a region where the fourth phosphor region 34 is disposed in the second arrangement region 42. That is, pieces of the light with four types of the chromaticities can be output from the light emitting device shown in FIG. 16.

Note that, also in the light emitting device shown in FIG. 16, in a similar way to the light emitting device shown in FIG. 15, the intensity of the emission light from the blue light emitting elements 10 adjusted, thus making it possible to adjust the color of the output light of the light emitting device.

Figures 17, 18:
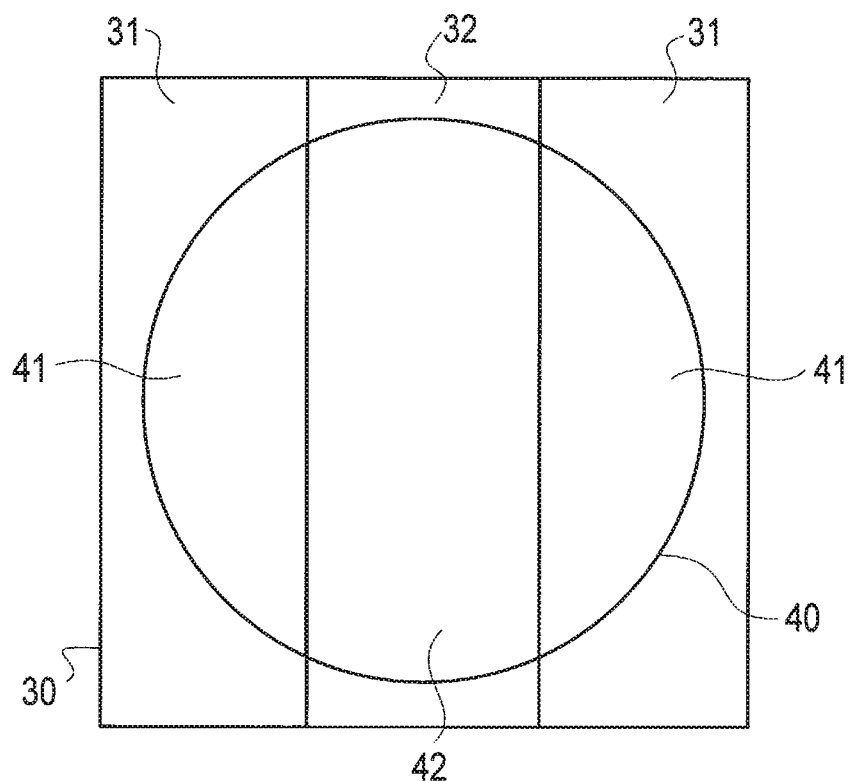
FIG. 17 is a table showing examples of pieces of output light of the light emitting devices according to the first and second embodiments of the present invention.
FIG. 18 is a schematic plan view showing a configuration of a light emitting device according to a third embodiment of the present invention.

FIG. 17 shows a table summarizing the chromaticities of the types of the output light from the light emitting devices shown in FIG. 1, FIG. 13, FIG. 15 and FIG. 16. In FIG. 17, "1" to "4" described in a column of "Light emitting device" correspond respectively to the light emitting devices shown in FIG. 1, FIG. 13, FIG. 15 and FIG. 16. Each section of a column of "Phosphor region" indicates the number phosphor regions obtained by dividing the phosphor sheet 30. Note that "single color" in a column of "Output light" in FIG. 17 indicates that light with predetermined target chromaticity is output from the light emitting device, and "adjusted color" therein indicates that it is possible to adjust the output light of the light emitting device.

As described above, the plural pieces of light with the different chromaticities are output from the light emitting device according to combinations of the arrangement regions and the phosphor regions. The types of the chromaticities are arbitrary settable depending on the way of dividing the phosphor region. In comparison with the case of applying the resin containing the phosphor, the use of the phosphor sheet 30 in which the shape is easy to process makes it possible to precisely set the regions where the respective phosphor regions are disposed. In this way, the variations in chromaticity can be suppressed.

Third Embodiment

In the above, the description has been given of the case of dividing the phosphor sheet 30 in the light emitting device in which the main surface of the substrate 40 is divided into two which are the first arrangement region 41 and the second arrangement region 42. As shown in FIG. 9, also in the light emitting device in which three arrangement regions are defined, the phosphor sheet 30 can be divided in a similar way.

FIG. 18 shows an example of dividing the phosphor sheet 30 for each of the arrangement regions in the light emitting device shown in FIG. 9. That is, the first phosphor regions 31 are disposed to individually overlap two first arrangement regions 41 disposed on the outer side, and the second phosphor region 32 is disposed to overlap the second arrangement region 42 disposed on the inner side. In this way, in the regions where the first phosphor regions 31 are caused to overlap the first arrangement regions 41, the light with Chromaticity 1 is output, and in the region where the second phosphor region 32 is caused to overlap the second arrangement region 42, the light with Chromaticity 2 is output.

<First Modification>

Figure 19:
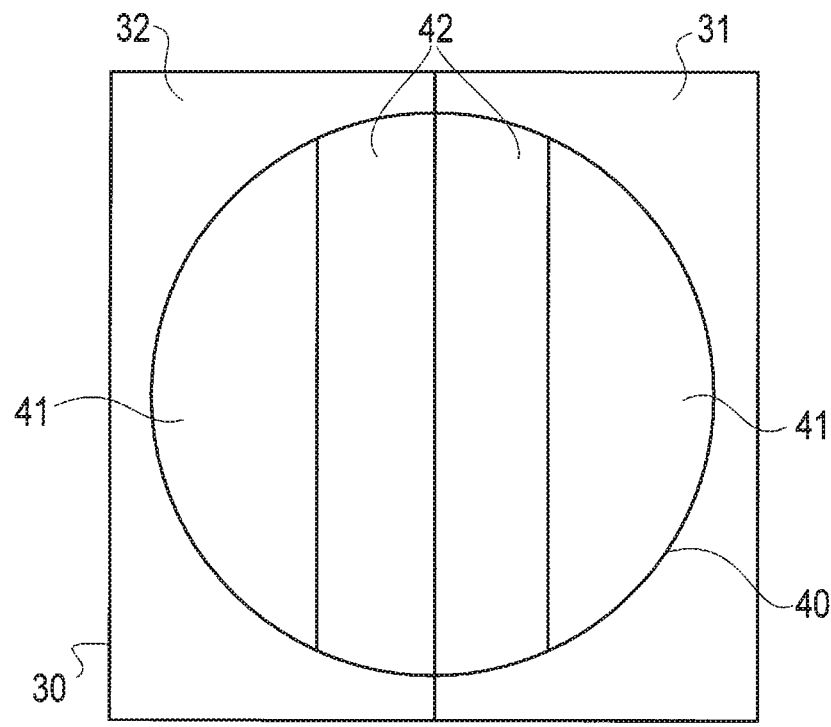
FIG. 19 is a schematic plan view showing a configuration of a light emitting device according to a first modification of the third embodiment of the present invention.

FIG. 19 shows an example where a plurality of the phosphor regions is disposed with respect to one arrangement region in the light emitting device shown in FIG. 9. In a light emitting device shown in FIG. 19, the first phosphor region 31 is disposed continuously on a part of the area above the first arrangement region 41 and a part of the area above the second arrangement region 42. Specifically, the first phosphor region 31 is disposed to overlap the first arrangement region 41 disposed on a right half of the view as FIG. 19 (hereinafter, this half will be simply referred to as a "right half") and to overlap a right portion of the second arrangement region 42. Then, the second phosphor region 32 is disposed to overlap the first arrangement region 41 disposed on a left side of the view as FIG. 19 (hereinafter, this side will be simply referred to as a "left side") and to overlap a left portion of the second arrangement region 42.

In the right region of the light emitting device shown in FIG. 19, light is obtained by mixing the first emission light and the excitation light of the first phosphor region 31, and light is obtained by mixing the second emission light and the excitation light of the first phosphor region 31. Then, these two pieces of light are mixed with each other, and output light with Color temperature A is obtained from the right region of the light emitting device. Meanwhile, in the left region of the light emitting device, light is obtained by mixing the first emission light and the excitation light of the second phosphor region 32, and light is obtained by mixing the second emission light and the excitation light of the second phosphor region 32. Then, these two pieces of light are mixed with each other, and output light with Color temperature B is obtained from the left region of the light emitting device.

<Second Modification>

Figure 20:
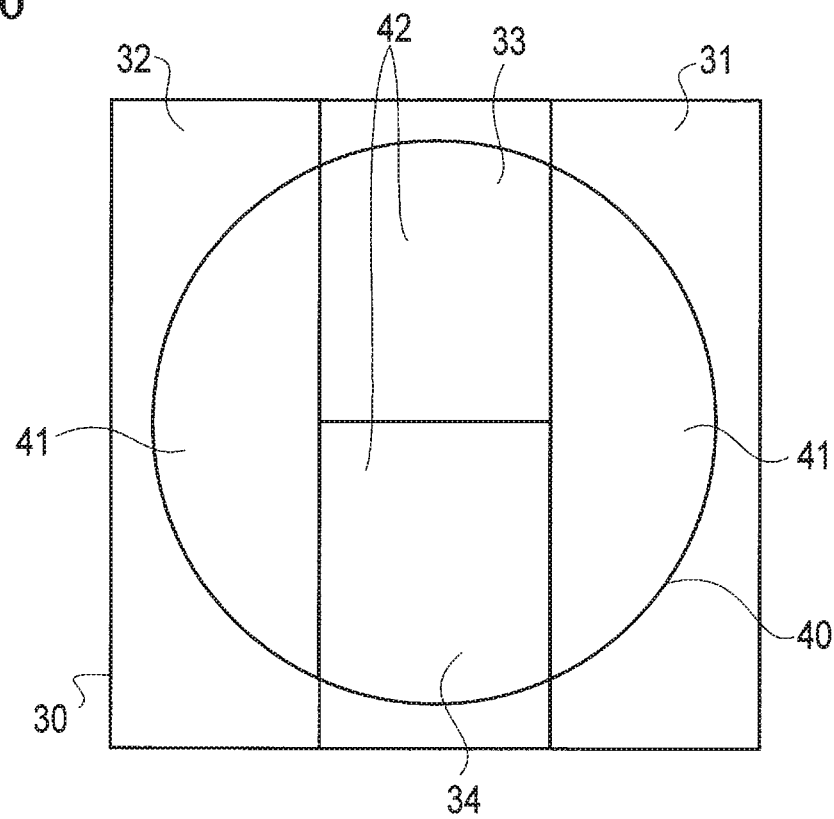
FIG. 20 is a schematic plan view showing a configuration of a light emitting device according to a second modification of the third embodiment of the present invention.

FIG. 20 shows an example where a plurality of the phosphor regions different for each of the arrangement regions is disposed in the light emitting device shown in FIG. 9. In a light emitting device shown in FIG. 20, the first phosphor region 31 is disposed to overlap the first arrangement region 41 on the right side, and the second phosphor region 32 is disposed to overlap the first arrangement region 41 on the left side. Then, the third phosphor region 33 is disposed to overlap a part of the second arrangement region 42, and the fourth phosphor region 34 is disposed to overlap the other part of the second arrangement region 42. In a similar way to the light emitting device shown in FIG. 16, pieces of light with four types of chromaticities are output from the light emitting device shown in FIG. 20 in response to combinations of the arrangement regions and the phosphor regions.

As described above, in a similar way to the light emitting device according to the second embodiment, in the light emitting device according to the third embodiment, the plural pieces of light with the different color temperatures and the plural pieces of light with the different chromaticities can be output according to the combinations of the arrangement regions and the phosphor regions. Others are substantially similar to those of the second embodiment, and a duplicate description will be omitted.

Fourth Embodiment

In a light emitting device according to a fourth embodiment of the present invention, two arrangement regions are defined concentrically with each other on the main surface of the substrate 40, and the phosphor sheet 30 is divided. For example, the phosphor sheet 30 is divided with respect to the light emitting device in which two arrangement regions are defined concentrically with each other as shown in FIG. 10.

Figure 21:
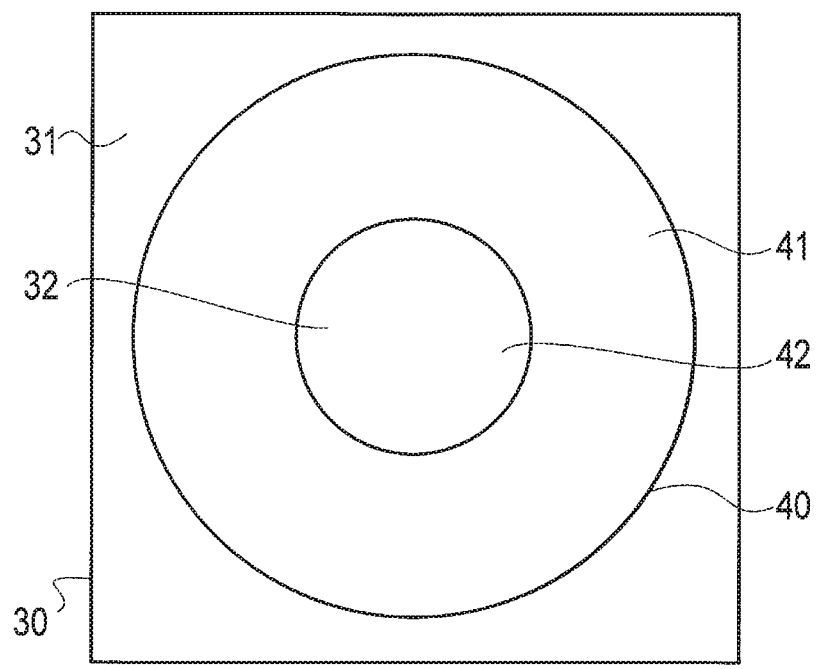
FIG. 21 is a schematic plan view showing a configuration of a light emitting device according to a fourth embodiment of the present invention.

FIG. 21 shows an example of dividing the phosphor sheet 30 for each of the arrangement regions in the light emitting device shown in FIG. 10. That is, the first phosphor region 31 is disposed to overlap the first arrangement region 41 disposed on the outer side, and the second phosphor region 32 is disposed to overlap the second arrangement region 42 disposed on the inner side. In this way, in the region where the first phosphor region 31 is caused to overlap the first arrangement region 41, the light with Chromaticity 1 is output, and in the region where the second phosphor region 32 is caused to overlap the second arrangement region 42, the light with Chromaticity 2 is output.

<First Modification>

Figure 22:
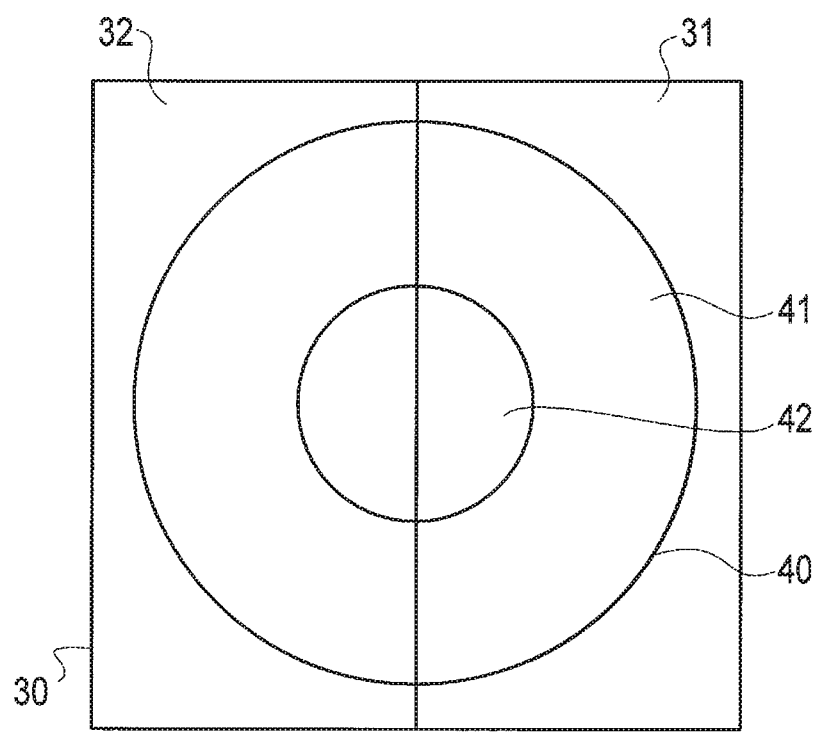
FIG. 22 is a schematic plan view showing a configuration of a light emitting device according to a first modification of the fourth embodiment of the present invention.

FIG. 22 shows an example where a plurality of the phosphor regions is disposed with respect to one arrangement region in the light emitting device shown in FIG. 10. In a light emitting device shown in FIG. 22, the first phosphor region 31 is disposed continuously on a part of the area above the first arrangement region 41 and a part of the area above the second arrangement region 42. Specifically, the first phosphor region 31 is disposed to overlap a right circular arc region of the first arrangement region 41 and a right semicircular region of the second arrangement region 42. Then, the second phosphor region 32 is disposed to overlap a left circular arc region of the first arrangement region 41 and a left semicircular region of the second arrangement region 42.

In the right region of the light emitting device shown in FIG. 22, light is obtained by mixing the first emission light and the excitation light of the first phosphor region 31, and light is obtained by mixing the second emission light and the excitation light of the first phosphor region 31. Then, these two pieces of light are mixed with each other, and output light with Color temperature A is obtained from the right region of the light emitting device. Meanwhile, in the left region of the light emitting device, light is obtained by mixing the first emission light and the excitation light of the second phosphor region 32, and light is obtained by mixing the second emission light and the excitation light of the second phosphor region 32. Then, these two pieces of light are mixed with each other, and output light with Color temperature B is obtained from the left region of the light emitting device.

<Second Modification>

Figure 23:
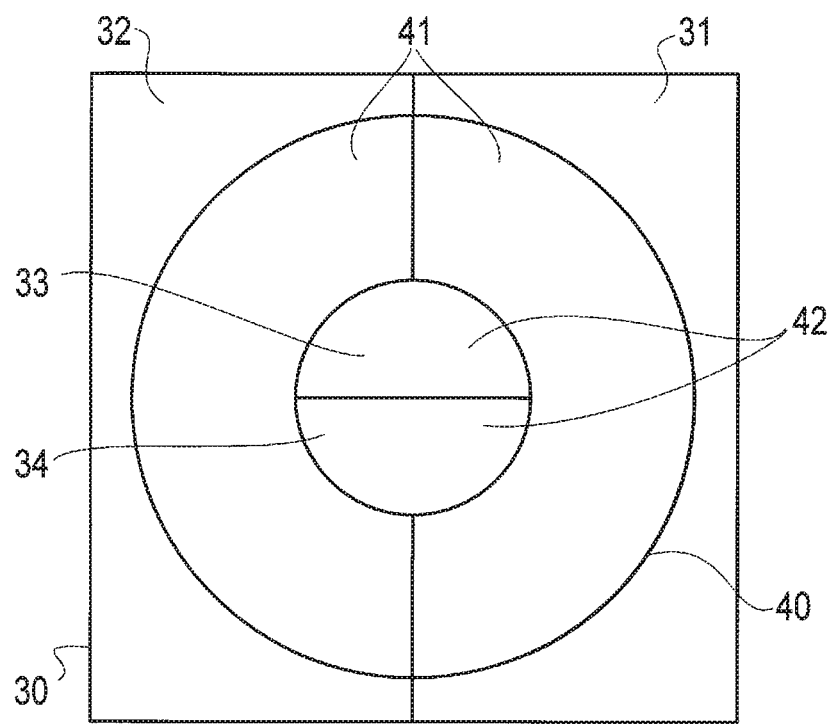
FIG. 23 is a schematic plan view showing a configuration of a light emitting device according to a second modification of the fourth embodiment of the present invention.

FIG. 23 shows an example where a plurality of the phosphor regions different for each of the arrangement regions is disposed in the light emitting device shown in FIG. 10. In a light emitting device shown in FIG. 23, the first phosphor region 31 is disposed to overlap a right circular arc region of the first arrangement region 41, and the second phosphor region 32 is disposed to overlap a left circular arc region of the first arrangement region 41. Then, the third phosphor region 33 is disposed to overlap a semicircular region of the second arrangement region 42 on an upper half of the view as FIG. 23, and the fourth phosphor region 34 is disposed to overlap a semicircular region of the second arrangement region 42 on a lower half of the view as FIG. 23. In a similar way to the light emitting device shown in FIG. 16, pieces of light with four types of chromaticities are output from the light emitting device shown in FIG. 23 by combinations of the arrangement regions and the phosphor regions. Note that, in the light emitting device shown in FIG. 23, it is necessary to devise a method of wiring the wires 50 in order to adjust the intensity of the emission light of the blue light emitting elements 10 for each of the phosphor regions.

As described above, also in the light emitting device according to the fourth embodiment, the plural pieces of light with the different color temperatures and the plural pieces of light with the different chromaticities can be output according to the combinations of the arrangement regions and the phosphor regions. Others are substantially similar to those of the second embodiment and the third embodiment, and a duplicate description will be omitted.

Other Embodiments

As above, the present invention has been described by the embodiment; however, it should not be understood that the description and the drawings, which form a part of this disclosure, limits the present invention. For those skilled in the art, varieties of alternative embodiments, examples and application technologies will be obvious from this disclosure.

Figure 24:
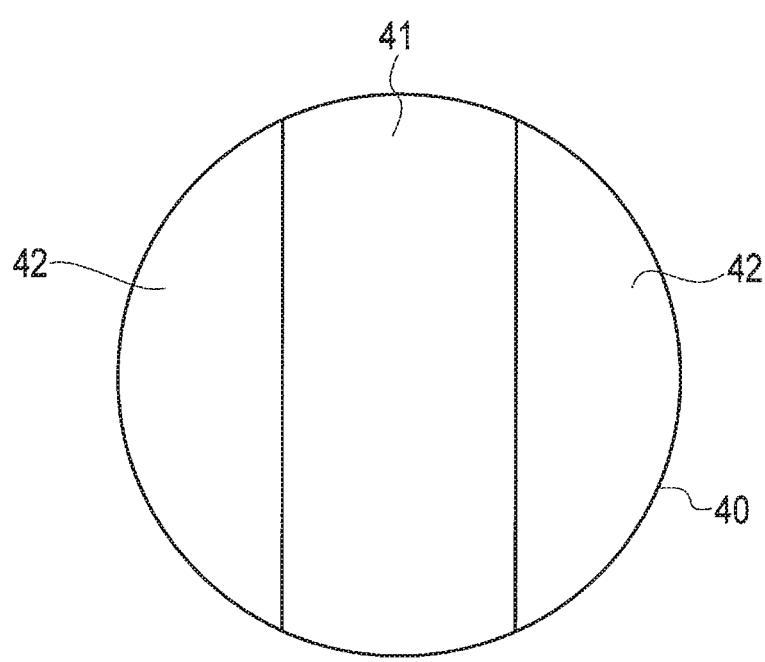
FIG. 24 is a plan view showing an example of arrangement regions in a substrate of a light emitting device according to another embodiment of the present invention.
Figure 25:
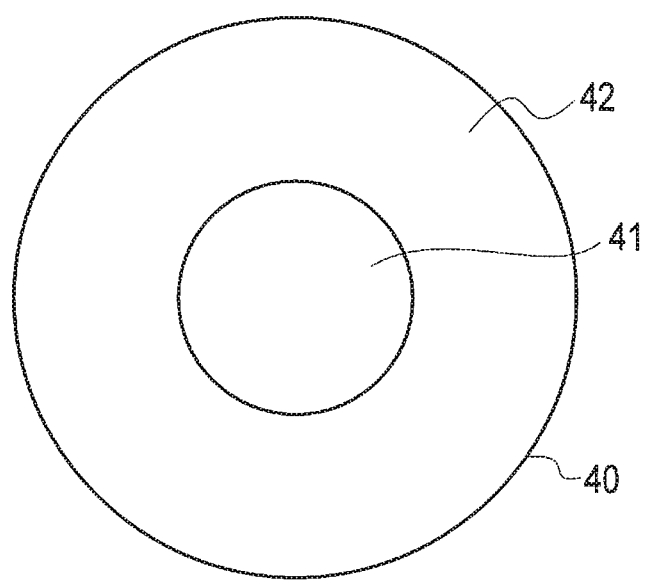
FIG. 25 is a plan view showing another example of the arrangement regions in the substrate of the light emitting device according to such another embodiment of the present invention.

For example, the above description illustrates such a light emitting device in which the first arrangement region 41 is disposed on the outer side of the second arrangement region 42 as shown in FIG. 9 and FIG. 10 in order to suppress the reduction of the intensity at the peak wavelength P1. However, as shown in FIG. 24 and FIG. 25, the first arrangement region 41 may be disposed on the inner side, and the second arrangement region 42 may be arranged on the outer side. For example, in a light emitting device shown in FIG. 24, semicircular second arrangement regions 42 are defined on both sides of a band-shaped first arrangement region 41. In a light emitting device shown in FIG. 25, a second arrangement region 42 that is annular when viewed from above is defined on an outer side of a first arrangement region 41 that is circular when viewed from above.

As described above, the second arrangement region 42 is disposed on the outer side of the first arrangement region 41, whereby the second blue light emitting elements 12 is caused to intentionally absorb a part of the first emission light. In this way, the light emission spectra of the output light are deformed, thus making it possible to output, from the light emitting device, light in which specific numerical values among the general color rendering index Ra and the special color rendering indices Ri are increased. For example, such a configuration is effective when the intensity at the peak wavelength P1 on the short wave side is desired to be reduced at an extremely low color temperature.

Note that, on the whole of the arrangement region shown in FIG. 24 or FIG. 25, the single phosphor sheet 30 may be disposed, or the phosphor sheet 30 may be divided as shown in the second to fourth embodiments.

The above description illustrates an outer edge of the region on the main surface of the substrate 40, on which the blue light emitting elements 10 are arranged, is circular. However, the outer edge of the region on which the blue light emitting elements 10 are arranged may be rectangular or polygonal.

As described above, it is natural that the present invention incorporates a variety of embodiments which are not described herein. Hence, the technical scope of the present invention is defined only by items specifying the invention, which are according to the scope of claims reasonable based on the above description.

INDUSTRIAL APPLICABILITY

The light emitting device according to the present invention is usable as a light emitting device that excites phosphors by light emitting elements and outputs light.

The invention claimed is:

1. A light emitting device of a chip on board-type comprising:
    a substrate having a main surface on which a first arrangement region and a second arrangement region are defined;
    a plurality of blue light emitting elements arranged on the main surface of the substrate;
    a phosphor sheet containing a phosphor that is excited by emission light from the plurality of blue light emitting elements and emits excitation light, the phosphor sheet being disposed above the plurality of blue light emitting elements; and
    an intermediate layer that covers the plurality of blue light emitting elements, the intermediate layer being disposed between the substrate and the phosphor sheet,
    wherein
    the plurality of blue light emitting elements includes first blue light emitting elements which emit first emission light having a first wavelength taken as a peak wavelength of a light emission spectrum, the first blue light emitting elements being arranged on the first arrangement region, and second blue light emitting elements which emit second emission light having a second wavelength taken as a peak wavelength of a light emission spectrum, the second blue light emitting elements being disposed on the second arrangement region, and the second wavelength being a longer wavelength than the first wavelength by a wavelength difference of at least 10 nm,
    the first arrangement region and the second arrangement region are provided such that a difficulty of the second blue light emitting elements to absorb the first emission light is increased,
    the phosphor sheet is divided into a plurality of phosphor regions when viewed from above, the plurality of phosphor regions being different from one another in at least either one of components and blending ratio of the phosphor,
    a refractive index of the intermediate layer is lower than a refractive index of the phosphor sheet,
    a film thickness of the intermediate layer is larger than ½ of an arrangement interval of the plurality of blue light emitting elements, and
    wires which sequentially connect the plurality of blue light emitting elements to one another are embedded in the intermediate layer.

2. The light emitting device according to claim 1, wherein a film thickness of the phosphor sheet is 50 μm to 100 μm.

3. The light emitting device according to claim 1, wherein the main surface is divided by one boundary line into the first arrangement region and the second arrangement region.

4. The light emitting device according to claim 1, wherein the first arrangement region is disposed on an outer side of the second arrangement region.

5. The light emitting device according to claim 1, wherein the plurality of phosphor regions includes:
    a first phosphor region disposed on a whole of an area above the first arrangement region; and
    a second phosphor region disposed on a whole of an area above the second arrangement region.

6. The light emitting device according to claim 1, wherein the plurality of phosphor regions includes:
    a first phosphor region disposed continuously on a part of an area above the first arrangement region and a part of an area above the second arrangement region; and a second phosphor region disposed continuously on other part of the area above the first arrangement region and other part of the area above the second arrangement region.

7. The light emitting device according to claim 1, wherein the plurality of phosphor regions includes:

a first phosphor region disposed on a part of an area above the first arrangement region;

a second phosphor region disposed on other part of the area above the first arrangement region;

a third phosphor region disposed on a part of an area above the second arrangement region; and a fourth phosphor region disposed on other part of the area above the second arrangement region.

8. The light emitting device according to claim 1, wherein the phosphor contained in the phosphor sheet is excited by the first emission light and emits first excitation light, and is excited by the second emission light and emits second excitation light, and outputs light obtained by mixing light with a first chromaticity and light with a second chromaticity with each other, the light with the first chromaticity being obtained by the first emission light and the first excitation light with each other, and the light with the second chromaticity being obtained by the second emission light and the second excitation light with each other.

9. The light emitting device according to claim 8, wherein the first chromaticity and the second chromaticity are located symmetrically to each other with respect to a predetermined chromaticity on an xy chromaticity diagram, and a difference between the first chromaticity and the second chromaticity is less than or equal to 0.04.

* * * * *